United States Patent
Kumar et al.

(10) Patent No.: US 12,081,218 B2
(45) Date of Patent: Sep. 3, 2024

(54) MULTIPHASE DIGITAL FREQUENCY SYNTHESIZER WITH FRACTIONAL DIVISION

(71) Applicant: NXP USA, Inc., Austin, TX (US)

(72) Inventors: Ravi Kumar, Noida (IN); Gaurav Agrawal, Noida (IN); Deependra Kumar Jain, Noida (IN); Krishna Thakur, GautamBudh Nagar (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/296,518

(22) Filed: Apr. 6, 2023

(65) Prior Publication Data

US 2024/0088879 A1    Mar. 14, 2024

(30) Foreign Application Priority Data

Sep. 13, 2022   (IN) .............................. 202211052246

(51) Int. Cl.
| | |
|---|---|
| *H03K 3/03* | (2006.01) |
| *H03K 3/017* | (2006.01) |
| *H03K 3/037* | (2006.01) |
| *H03K 5/00* | (2006.01) |
| *H03K 19/20* | (2006.01) |

(52) U.S. Cl.
CPC ......... *H03K 5/00006* (2013.01); *H03K 3/017* (2013.01); *H03K 3/0315* (2013.01); *H03K 3/037* (2013.01); *H03K 19/20* (2013.01)

(58) Field of Classification Search
CPC ....... H03L 7/1974; H03L 7/1976; H03L 7/07; H03L 7/18; H03L 7/085; H03L 2207/50; H03L 7/183; H03L 7/197; H03L 7/091; H03L 7/0814; H03L 7/0891; H03L 7/087; H03L 7/081; H03L 7/099; H03L 7/093; H03L 7/16; H03L 7/0995; H03L 7/0807; H03L 7/0805; H03K 5/00006; H03K 3/017; H03K 3/0315; H03K 3/037; H03K 19/20; H03K 23/68; G06F 1/08; G06F 1/10

See application file for complete search history.

(56) References Cited

U.S. PATENT DOCUMENTS 6,329,850 B1 *   12/2001   Mair ........................ H03L 7/18
                                                            327/107
6,526,374 B1 *    2/2003   Martin ................. H03L 7/0996
                                                            375/376

(Continued)

*Primary Examiner* — John W Poos

(57) ABSTRACT

A multiphase digital frequency synthesizer including a multiphase ring oscillator that provides phased clock signals, a clock divider that divides a phased clock signal by an integer value and a carry value to provide a divided clock signal, positive select circuitry that determines and updates a positive select value with accumulation and a modulo function based on a fractional division factor updated with successive cycles of the divided clock signal, carry circuitry that determines the carry value based on a number of the phased clock signals, positive multiplex circuitry that selects from among the phased clock signal using the positive select value for providing a positive multiplexed clock signal, and fractional phase addition circuitry that provides a first output clock signal based on a selected phased clock signal, the divided clock signal, and the positive multiplexed clock signal. Similar negative select circuitry and duty cycle correction circuitry may be included.

20 Claims, 8 Drawing Sheets

(56) References Cited

U.S. PATENT DOCUMENTS

| | | |
|---|---|---|
| 7,365,580 B2 | 4/2008 | Martin et al. |
| 7,496,168 B2 | 2/2009 | Leonowich et al. |
| 8,664,988 B1 | 3/2014 | Xiu |
| 11,909,406 B1 * | 2/2024 | Hussein .................. H03L 7/093 |
| 2005/0258879 A1 * | 11/2005 | Marutani ............... H03K 23/44 |
| | | 327/117 |
| 2009/0041104 A1 * | 2/2009 | Bogdan ..................... H03L 7/08 |
| | | 375/226 |
| 2020/0212916 A1 * | 7/2020 | Moe ..................... H03K 3/0315 |

* cited by examiner

MULTIPHASE DIGITAL FREQUENCY SYNTHESIZER WITH FRACTIONAL DIVISION

CROSS-REFERENCE TO RELATED APPLICATIONS

This application claims the priority under 35 U.S.C. § 119 of India application no. 202211052246, filed on 13 Sep. 2022, the contents of which are incorporated by reference herein.

BACKGROUND

Field of the Invention

The present invention relates in general to frequency synthesizers, and more particularly to a system and method of dividing the frequency of an oscillator by a fractional number.

Description of the Related Art

It is often desired to divide down the frequency of an oscillator by a fractional value. Since the reduced frequency oscillator signal may be used as a clock signal and synchronization, it should have minimal jitter and a desired duty cycle, such as at or near a 50% duty cycle. Power dissipation and circuit space are also ongoing concerns, particularly for high speed clocking applications.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A multiphase digital frequency synthesizer with fractional division as described herein may be used for voltage-controlled oscillator (VCO) clock phases with a selected minimum fractional resolution. The synthesizer architecture as described herein overcomes the speed limitations of conventional designs and allows it to be used for high speed VCO clock phases. In one embodiment of the synthesizer architecture described herein, the output signal can be adjusted to achieve at or near 50% duty cycle within the fractional resolution even in fractional division. In addition, the synthesizer architecture as described herein does not add any extra jitter to clock even after the fractional division. The synthesizer architecture enables low power consumption in which custom logic circuitry may be used to drastically reduce the power dissipation. The synthesizer architecture provides a flexible design that can use any number of equidistant phases from the available phases, which reduces over-design and power consumption.

As an example, a 5 Gigahertz (GHz) input clock with a period of 200 picoseconds (ps) may be divided by 2.4 to achieve a 2.08 GHz output clock with a period of 480 ps. In one embodiment, an operating frequency of about 7 GHz may be achieved in 5 nano-meter (nm) CMOS technology and an operating frequency of about 5.5 GHz may be achieved in 16 nm CMOS technology. Therefore, the multiphase digital frequency synthesizer with fractional division as described herein is suitable for high-speed clocking applications.

Figure 1:
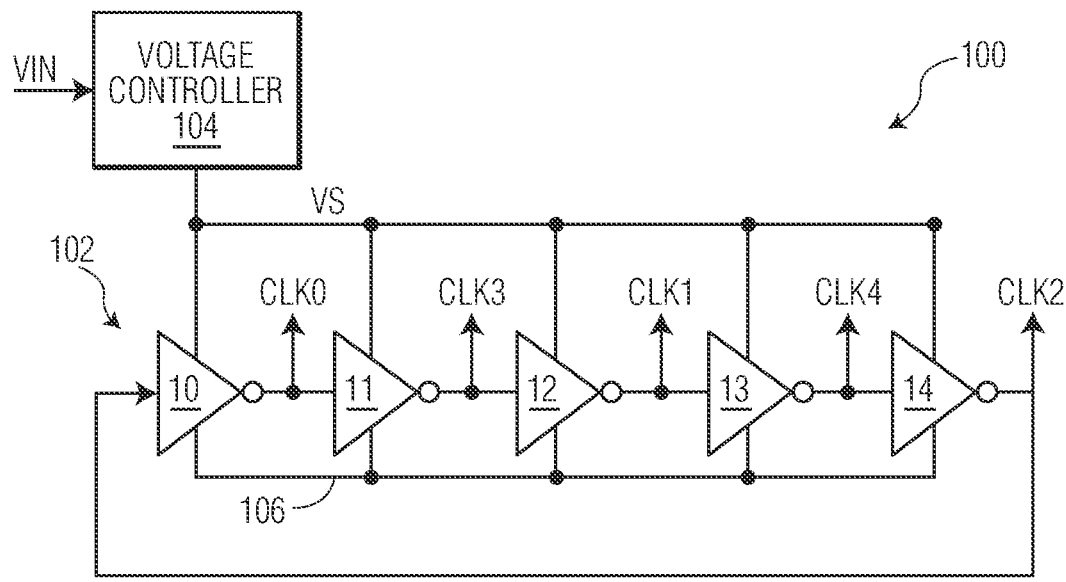
FIG. 1 is a simplified schematic and block diagram of a VCO implemented according to one embodiment.

FIG. 1 is a simplified schematic and block diagram of a VCO 100 implemented according to one embodiment. The VCO 100 is configured as a ring oscillator including a number "R" of inverters 102, individually labeled I0, I1, ... IR−1, coupled in series in a loop configuration, in which R is an integer greater than 1. R may be odd for some configurations (such as a series of inverters as shown), although R may be even for other configurations, such as for differential oscillators or the like. R also determines the number of clock signals at different phases, collectively referred to herein as phased clock signals. In the illustrated configuration, R is 5, although an alternative odd number of inverters 102 may be included for less or greater fractional division resolution. Each of the inverters 102 are substantially identical meaning that they are about the same in size and configuration. A voltage controller 104 receives an input voltage VIN and outputs a source voltage VS to a supply voltage input of each of the inverters 102, each having a reference supply input coupled to a reference voltage node 106 developing a reference voltage VREF. VREF may be any suitable positive, negative, or zero voltage level, such as ground or the like.

In operation, VIN is applied to adjust the voltage level of VS, and the VCO 100 oscillates at an input oscillation frequency $F_{IN}$ based on various factors, including, for example, the number, size, and configuration of inverters 102, along with the voltage differential between VS and VREF. For a given ring oscillator with a predetermined number of inverters 102, the input oscillation frequency $F_{IN}$ may be adjusted by adjusting VIN causing a corresponding adjustment of VS. Each of the inverters 102 generates a different one of the R phased clock signals, shown as CLK0, CLK1, CLK2, CLK3, and CLK4 for R=5. Because of the symmetry of the ring oscillator, each of the phased clock signals has a 50% duty cycle and are equidistantly separated from each other in time by $T_{IN}/5$, in which "$T_{IN}$" denotes a period of the oscillation frequency $F_{IN}$. As shown, inverter I0 outputs clock signal CLK0 which is provided to the input of inverter I1, I1 outputs clock signal CLK3 which is provided to the input of inverter I2, I2 outputs clock signal CLK1 which is provided to the input of inverter I3, I3 outputs clock signal CLK4 which is provided to the input of inverter I4, and I4 outputs clock signal CLK2 which is fed back to the input of the inverter I0 in the ringed configuration.

Figure 2:
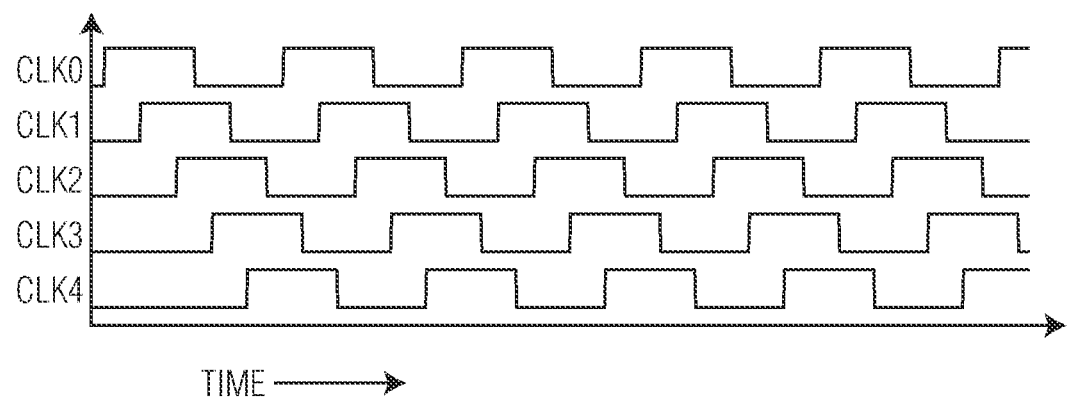
FIG. 2 is a timing diagram plotting each of the clock signals of FIG. 1 versus time.

FIG. 2 is a timing diagram plotting each of the clock signals CLK0-CLK4 versus time for R=5. As shown, each of the phased clock signals CLK0-CLK4 has a 50% duty cycle, in which CLK1 is delayed by $T_{IN}/5$ relative to CLK0, CLK2 is delayed by $T_{IN}/5$ relative to CLK1, CLK3 is delayed by $T_{IN}/5$ relative to CLK2, CLK4 is delayed by $T_{IN}/5$ relative to CLK3, and in the following clock cycle, CLK0 is delayed by $T_{IN}/5$ relative to CLK4, and so on. In general for any value of R, the VCO 100 develops R 50% duty cycle phased clock signals which are temporally separated by $T_{IN}/R$ from each other.

The VCO 100 is used to develop an input clock signal CLKIN with the input oscillation frequency $F_{IN}$ (e.g., CLK0), and is further used to divide down the frequency of the input clock signal by a fractional number. The fractional number includes an integer divider value MFI added to a fractional value MFN/R in which MFN is a fractional division factor with a value selected from 0, 1, 2, . . . , R−1. MFN/R determines the resolution of a fractional division value used for dividing the frequency of CLKIN. For R=5, for example, the resolution is 0.2 for fractional division values 0.0, 0.2, 0.4, 0.6, and 0.8. The R value may be increased to achieve greater fractional divisional resolution.

Figure 3:
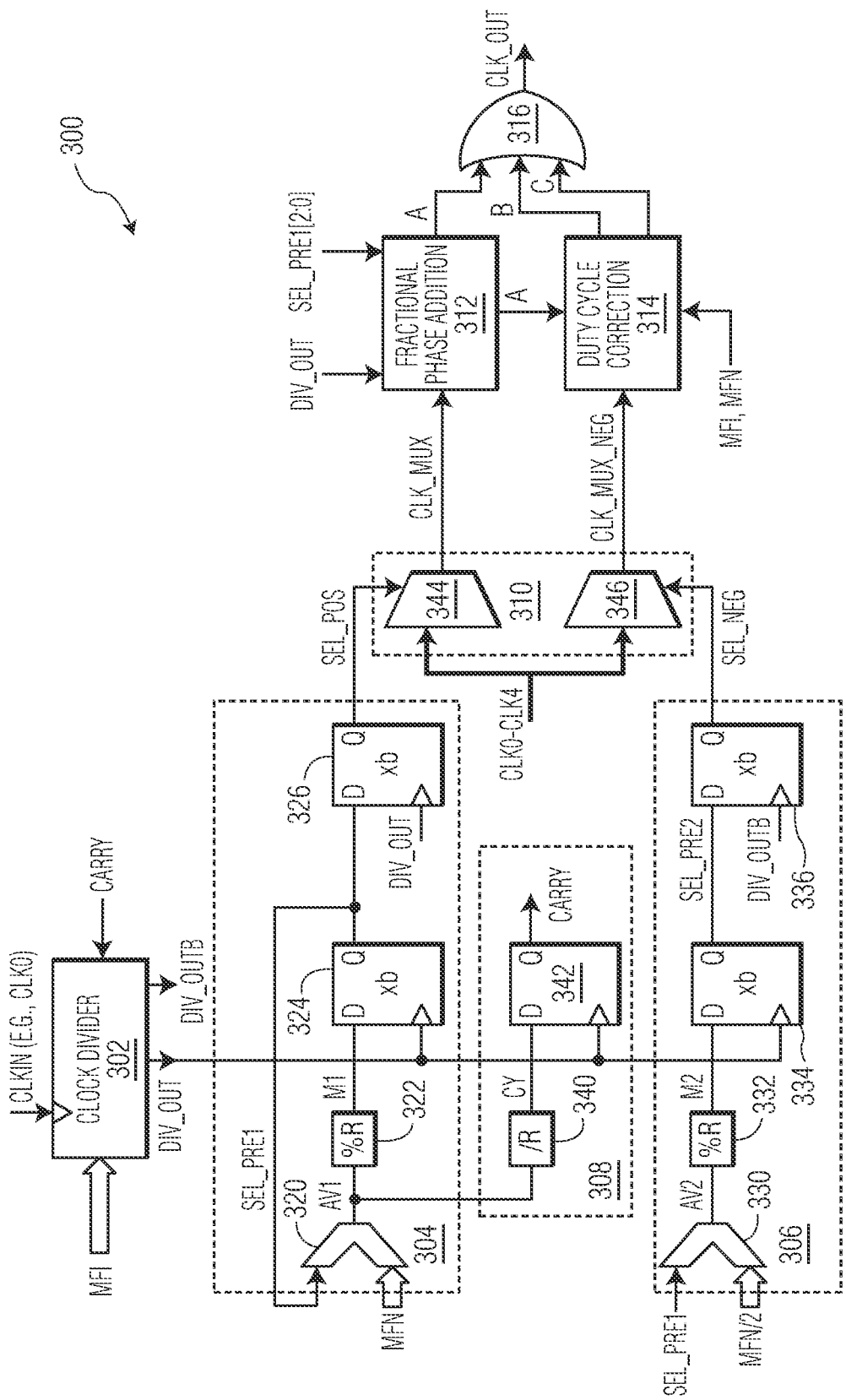
FIG. 3 is a simplified schematic and block diagram of a multiphase digital frequency synthesizer with fractional division implemented according to one embodiment.

FIG. 3 is a simplified schematic and block diagram of a multiphase digital frequency synthesizer with fractional division 300 implemented according to one embodiment. The frequency synthesizer 300 includes a clock divider 302, positive select circuitry 304, negative select circuitry 306, carry circuitry 308, multiplex circuitry 310, fractional phase addition circuitry 312, duty cycle correction circuitry 314, and output clock combination circuitry 316. The clock divider 302 receives the integer divider value MFI, an input clock signal CLKIN which may be a selected one of the phased clock signals CLK0-CLK4 (e.g., CLK0), and a signal CARRY, and outputs a divided clock signal DIV_OUT. The frequency of the input clock signal CLKIN is the input oscillation frequency $F_{IN}$ as previously described. Generally, the clock divider 302 divides the frequency of the CLKIN by MFI+CARRY for developing the frequency of DIV_OUT. The CARRY signal is an overflow signal, such that when CARRY is zero, the frequency of DIV_OUT is $F_{IN}$/MFI, and when CARRY is one, the frequency of DIV_OUT is $F_{IN}$/(MFI+1). The clock divider 302 may also output an inverted clock signal DIV_OUTB, which is an inverted version of DIV_OUT.

In one embodiment, MFI may be an 8-bit digital value ranging from 2 to 255. It is understood, however, that MFI may have a different number of bits more or less than 8 defining a different maximum integer value. CARRY may be a single bit value and is either 0 or 1.

The positive select circuitry 304 includes a digital accumulator 320, a modulo circuit 322, first synchronization circuitry 324, and second synchronization circuitry 326. The digital accumulator 320 has a first input receiving a preliminary positive select value SEL_PRE1, a second input receiving the MFN value, and an output providing a first accumulated value AV1. AV1 is provided to an input of the modulo circuit 322, which has an output providing a first modulo value M1 to a data input of the first synchronization circuitry 324. The first synchronization circuitry 324 has a clock input receiving DIV_OUT and has an output providing the preliminary positive select value SEL_PRE1. The SEL_PRE1 value is provided to a data input of the second synchronization circuitry 326, which has a clock input receiving DIV_OUT, and which has an output providing a positive select value SEL_POS.

The MFN, M1, SEL_PRE1, and SEL_POS values have a selected number of bits "b" based on the R value. An R value of 5, for example, may be digitally defined using 3 bits which determines a fractional division resolution of 0.2 with fractional division values 0.0, 0.2, 0.4, 0.6, and 0.8 (since MFN is limited to a maximum value of R−1). The R value may be increased to achieve greater fractional divisional resolution if desired. R may be increased to 7, for example, which may still be defined using b=3 bits. Further increase of R increases the number of bits b. The first and second synchronization circuitry 324 and 326 may be implemented as multiple data or D-type flip-flops or the like and are notated with "xb" denoting the number of flip-flops and corresponding bits. Each D-type flip-flop has a data "D" input and a non-inverting "Q" output. It is noted that AV1 may reach a maximum value of twice MFN with b+1 bits so that the modulo circuit 322 is implemented to handle b+1 bits.

In operation of the positive select circuitry 304, assuming, for example, that SEL_PRE1 and SEL_POS are initially 0 and MFN=2. The accumulator 320 adds 0 to 2 and outputs AV1=2, and the modulo circuit 322 performs 2 modulo 5 and outputs M1=2. In the first cycle of DIV_OUT (e.g., in response to a first rising edge of DIV_OUT), SEL_PRE1=2, SEL_POS remains 0, AV1=2+2=4, and M1=4. In the second cycle of DIV_OUT (e.g., in response to the second rising edge of DIV_OUT), SEL_PRE1=4, SEL_POS=2, AV1=4+2=6, and the modulo circuit 322 performs 6 modulo 5 and outputs M1=1. In the third cycle of DIV_OUT (e.g., in response to the third rising edge of DIV_OUT), SEL_PRE1=1, SEL_POS=4, AV1=1+2=3, and the modulo circuit 322 performs 3 modulo 5 and outputs M1=3. Operation continues in this manner so that in successive cycles of DIV_OUT, the pattern of SEL_PRE1 is 0, 2, 4, 1, 3, 0, 2, 4, 1, 3, and so on with a repeating pattern. SEL_POS has a similar pattern as SEL_PRE1 but is delayed by one cycle of DIV_OUT, or 0, 0, 2, 4, 1, 3, 0, . . . .

In this manner, ignoring the first cycle, SEL_POS is incremented by MFN each successive cycle and the modulo function causes the values to wrap around the possible values of 0-4 corresponding to the 5 phased clock signals CLK0-CLK4, respectively. Operation is similar for different values of MFN with a correspondingly different increment. For MFN=1, for example, and ignoring first cycle, the pattern of SEL_POS is 0, 1, 2, 3, 4, 0, 1, . . . , and for MFN=3 and ignoring first cycle, the pattern of SEL_POS is 0, 3, 1, 4, 2, 0, 3, . . . , and so on.

The negative select circuitry 306 includes a digital accumulator 330, a modulo circuit 332, first synchronization circuitry 334, and second synchronization circuitry 336. The digital accumulator 330 has a first input receiving SEL_PRE1, a second input receiving the MFN/2, and an output providing a second accumulated value AV2. AV2 is provided to an input of the modulo circuit 332, which has an output providing a second modulo value M2 to a data input of the first synchronization circuitry 334. The first synchronization circuitry 334 has a clock input receiving DIV_OUT and has an output providing the preliminary negative select value SEL_PRE2. The SEL_PRE2 value is provided to a data input of the second synchronization circuitry 336, which has a clock input receiving DIV_OUTB, and which has an output providing a negative select value SEL_NEG.

The negative select circuitry 306 is substantially similar to the positive select circuitry 304, in which the M2, SEL_PRE2, and SEL_NEG values also have "b" bits based on the R value as previously described. The fractional portion of MFN/2 is truncated and discarded. For example, if MFN is 3, then MFN/2 is 1 (rather than 1.5). In a digital configuration, if MFN is stored in a first register, then MFN may be copied into a second register that is then right-shifted 1-bit (without remainder) to provide MFN/2. The first and second synchronization circuitry 334 and 336 may also be implemented as multiple data or D-type flip-flops or the like and are notated with "xb" denoting the number of flip-flops and corresponding bits. It is noted that AV2 has a maximum value that is twice MFN with b+1 bits so that the modulo circuit 332 is implemented to handle b+1 bits.

Operation of the negative select circuitry 306 is substantially similar to operation of the positive select circuitry 304. Since SEL_PRE1 is also provided to an input of the accumulator 330, the pattern of SEL_NEG is essentially the same. Since the other input of the accumulator 330 is the truncated MFN/2 value and since the second synchronization circuitry 336 is clocked by DIV_OUTB rather than DIV_OUT, SEL_NEG is shifted in time relative to SEL_POS during operation. As further described herein, the positive select circuitry 304 is used to select from among the phased clock signals CLK0-CLK4 for selecting positive or rising edges of an output clock signal CLK_OUT, whereas the negative select circuitry 306 is used to select from among the phased clock signals CLK0-CLK4 for selecting negative or falling edges of an output clock signal CLK_OUT for duty cycle correction to maintain 50% duty cycle.

The carry circuitry 308 includes a divider 340 and synchronization circuitry 342. The divider 340 has an input receiving AVI and an output providing a carry signal CY to a data input of the synchronization circuitry 342, which has a clock input receiving DIV_CLK and an output providing the CARRY signal. The divider 340 is configured to divide AV1 by R to with fractional output truncated, so that CY is 0 when AV1 is less than R and 1 when AV1 is greater than R. Thus, during operation, when AV1 is greater than R, CY is 1 and upon the next rising edge of DIV_CLK, CARRY goes to 1. When CARRY is 1, the clock divider 302 divides the frequency of CLKIN by MF1+1 for that cycle. In this manner, the CARRY signal serves as an overflow signal, such that when CARRY is 0, the frequency of DIV_OUT is $F_{IN}/MFI$, and when CARRY is 1, the frequency of DIV_OUT is $F_{IN}/(MFI+1)$.

The multiplex circuitry 310 includes a positive multiplexer (MUX) 344 and a negative MUX 346. Each of the MUXes has at least R=5 inputs receiving the phased clock signals CLK0-CLK4. The positive MUX 344 has a select input receiving SEL_POS and has an output providing a positive multiplexed clock signal CLK_MUX, and the negative MUX 346 has a select input receiving SEL_NEG and has an output providing a negative multiplexed clock signal CLK_MUX_NEG.

The SEL_PRE1 value and the CLK_MUX and DIV_OUT signals are provided to respective inputs of the fractional phase addition circuitry 312, which has an output providing a preliminary output clock signal A. The A and CLK_MUX_NEG signals and the MFI and MFN values are provided to respective inputs of the duty cycle correction circuitry 314, which outputs duty cycle correction signals B and C. The A, B, and C signals are provided to respective inputs of the output clock combination circuitry 316, which has an output providing the output clock signal CLK_OUT. In one embodiment, the output clock combination circuitry 316 may be implemented as a 3-input Boolean logic OR-gate that digitally adds A, B, and C together to develop CLK_OUT.

Figure 4:
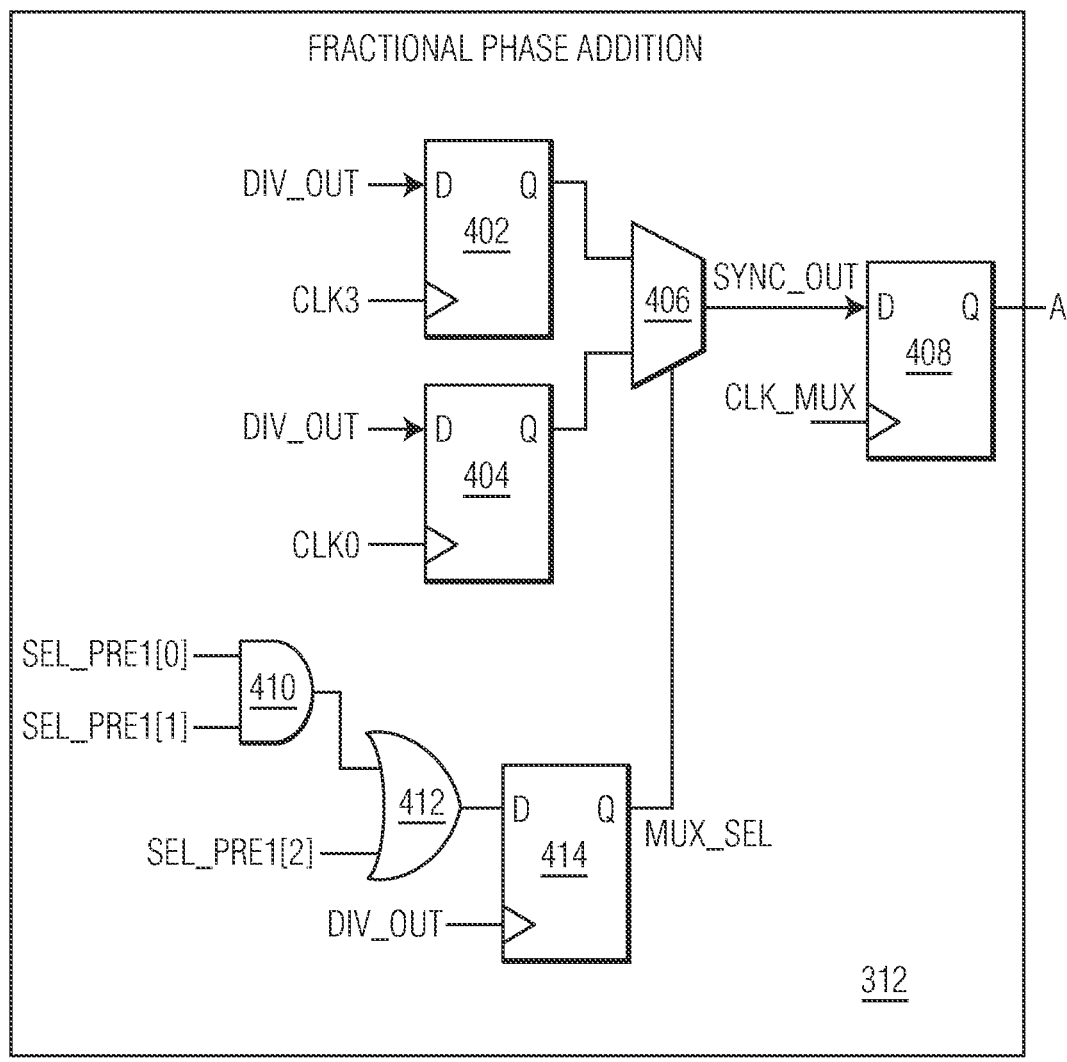
FIG. 4 is a schematic diagram of the fractional phase addition circuitry of FIG. 3 according to one embodiment.

FIG. 4 is a schematic diagram of the fractional phase addition circuitry 312 according to one embodiment. The divided clock signal DIV_OUT is provided to the data input of first and second synchronization circuitry 402 and 404, each having an output provided to respective inputs of a MUX 406. The first synchronization circuitry 402 has a clock input receiving CLK3 and the second synchronization circuitry 404 has a clock input receiving CLK0. The MUX 406 has a select input receiving a multiplex select signal MUX_SEL and has an output providing an output synchronization signal SYNC_OUT. SYNC_OUT is provided to an input of third synchronization circuitry 408, which has a clock input receiving the positive multiplexed clock signal CLK_MUX and which has an output providing the A signal.

Each of the digital values may have a value determined by a selected number of bits. The SEL_PRE1 value, for example, may have 3 bits and may alternatively be expressed as SEL_PRE1[2:0] in which bit "0" is the least significant bit. The two least significant bits SEL_PRE1[0] and SEL_PRE1[1] are provided to respective inputs of a 2-input Boolean logic AND gate 410, having an output coupled to one input of a 2-input Boolean logic OR gate 412. The most significant bit SEL_PRE1[2] is provided to the other input of the OR gate 412, which has an output coupled to the data input of fourth synchronization circuitry 414. The fourth synchronization circuitry 414 has a clock input receiving DIV_OUT and an output providing the MUX_SEL signal.

The synchronization circuitry 402, 404, 408, and 414 may each be implemented as a D-type flip-flop. In operation, the synchronization circuitry 402 samples DIV_OUT using CLK3 and the synchronization circuitry 404 samples DIV_OUT using CLK0. When the value of SEL_PRE1 is less than 3 (e.g., binary values 000, 001, or 010), then the output of synchronization circuitry 402 using CLK3 is selected by the MUX 406 as the SYNC_OUT signal, and otherwise the MUX 406 selects the output of synchronization circuitry 404 using CLK0 as the SYNC_OUT signal. The synchronization circuitry 408 samples SYNC_OUT using CLK_MUX for developing the preliminary output clock signal A.

Figure 5:
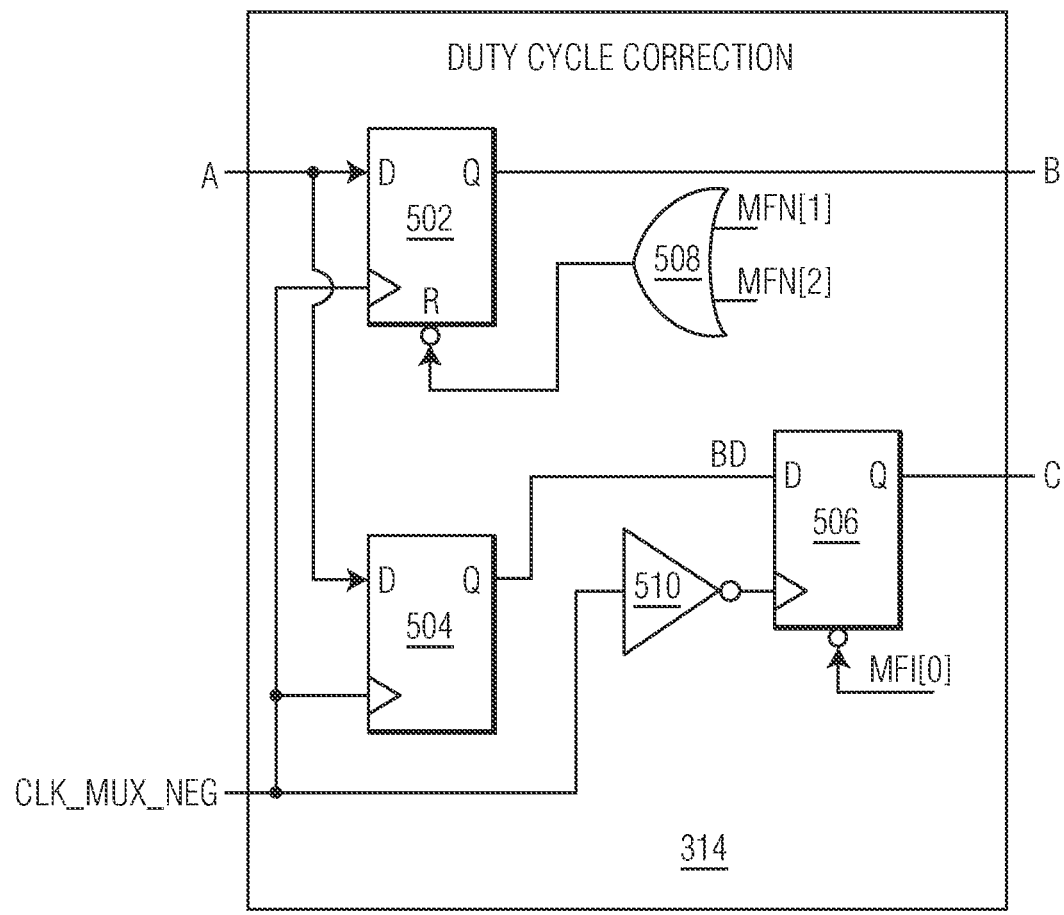
FIG. 5 is a schematic diagram of the duty cycle correction circuitry of FIG. 3 according to one embodiment.

FIG. 5 is a schematic diagram of the duty cycle correction circuitry 314 according to one embodiment. The duty cycle correction circuitry 314 includes synchronization circuitry 502, 504, and 506, a 2-input Boolean logic OR gate 508, and an inverter 510. The A signal is provided to the data inputs of the synchronization circuitry 502 and 504, each having a clock input receiving the negative multiplexed clock signal CLK_MUX_NEG. The bits MFN[1] and MFN[2] of the MFN value are provided to the two inputs, respectively, of the OR gate 508, which has an output coupled to an inverting reset input of the synchronization circuitry 502. The synchronization circuitry 502 has an output providing the B signal. The synchronization circuitry 504 has an output providing a duplicate B signal BD to the data input of the synchronization circuitry 506. CLK_MUX_NEG is provided to an input of the inverter 510, having an output coupled to the clock input of the synchronization circuitry 506. The least significant bit MFI[0] of the MFI value is provided to an inverting reset input of the synchronization circuitry 506, which has an output providing the C signal.

The architecture of the frequency synthesizer 300 shown in FIGS. 3, 4, and 5 enables use of high speed clock phases such as those developed by the VCO 100 shown in FIG. 1. Custom logic may be used which drastically reduces power consumption. The architecture is flexible and can use any number of equidistant phases from the available phases, which reduces over-design and power consumption. The architecture implements fraction generation and duty cycle correction. The positive select circuitry 304 is used to adjust the fractional phase and the negative select circuitry 306 is used for duty cycle correction. The DIV_OUT signal from the clock divider 302 is pre-synchronized with two different ones of the phased clock signals by the fractional phase addition circuitry 312 to meet timing requirements. One of the pre-synchronized clock signals is used when the fraction is less than 0.5 and the other is used when the fraction is greater than 0.5. Fractional frequency generation is achieved by shifting the rising edge of the pre-synchronized signal whereas falling edge is adjusted for duty cycle correction. Additional circuitry is provided to add half of a clock cycle to the output and implemented to correct duty cycle in case of the odd integer division number. Resolution of the architecture is 1/R in which R denotes the number of phased clock signals.

Figure 6:
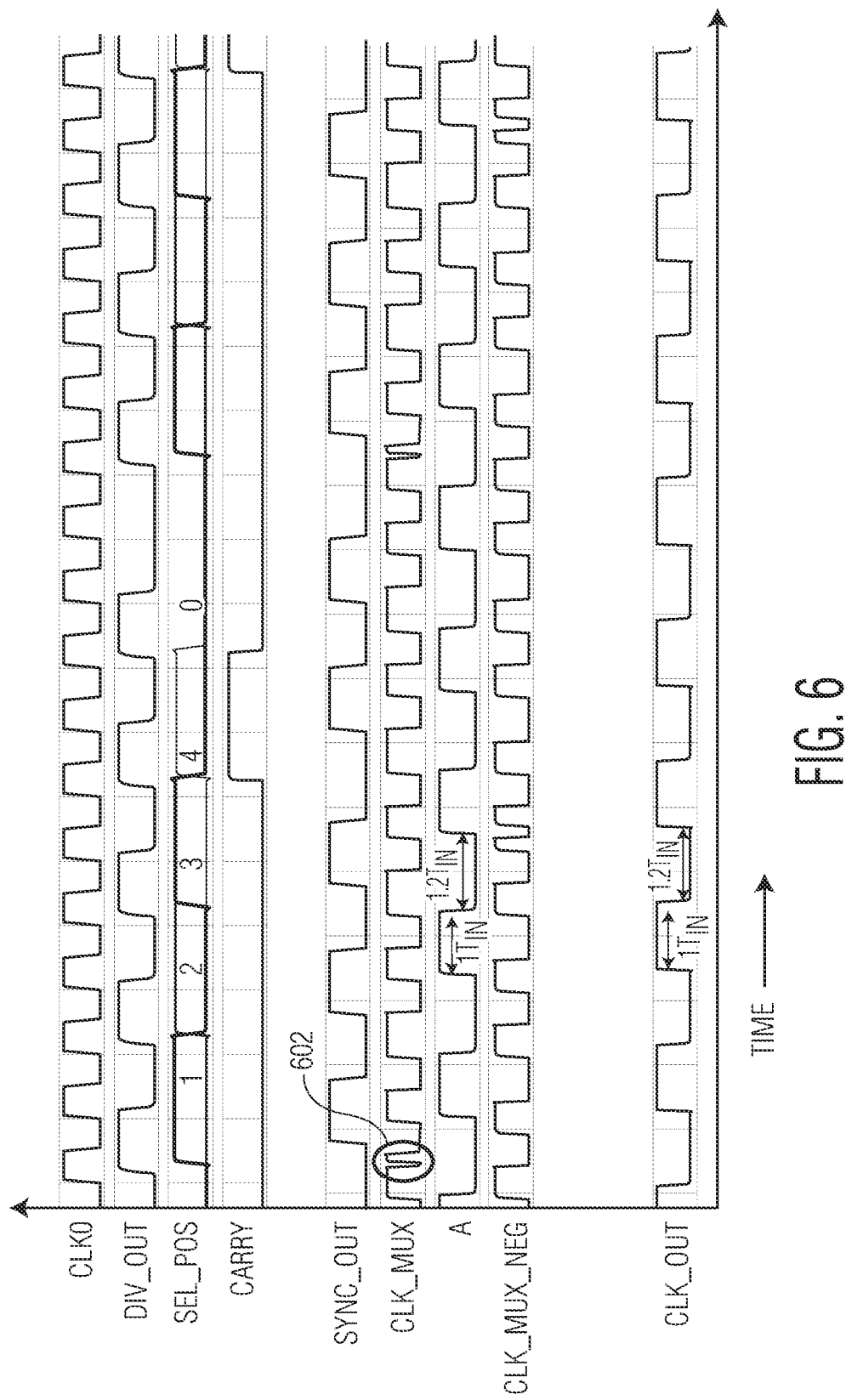
FIGS. 6, 7, 8, and 9 are timing diagrams plotting applicable signals of the multiphase digital frequency synthesizer with fractional division of FIG. 3 for various values of an integer divider value.

FIG. 6 is a timing diagram plotting the CLK0, DIV_OUT, SEL_POS, CARRY, SYNC_OUT, CLK_MUX, A, and CLK_OUT signals and values versus time for the frequency synthesizer 300 using the phased clock signals from the VCO 100 and for MFI=2 and MFN=1. These parameters correspond with frequency division by a factor of (MFI+MFN/5)=2.2, which also means period extension by 2.2. Thus, given the original period $T_{IN}$ of the input clock signal CLKIN, the period of the output clock signal CLK_OUT is $T_{OUT}=2.2*T_{IN}$, in which an asterisk "*" denotes multiplication as used herein. The SEL_NEG value and the signals CLK_MUX_NEG, B, and C are not shown since B and C are disabled for MFI=2 and MFN=1 with reference to the duty cycle correction circuitry 314 shown in FIG. 5, in which MFN[1] and MFN[2] are both 0 and MFI[0] is 0.

Initially, CARRY is a logic "0" so that DIV_OUT starts at a frequency that is one-half of CLK0 since MFI is 2. When SEL_PRE1 has a value of 4 (not shown, but coincident with SEL_POS having a value of 3), AV1 is 5 and CY goes to 1. When DIV_OUT next goes high when SEL_POS is 3 and while CY is 1, then the synchronization circuitry 342 asserts CARRY high to a logic "1". In the next cycle of DIV_OUT, CARRY goes back to 0 and DIV_OUT is extended by a cycle of CLK0 and stays low for two cycles of CLK0. DIV_OUT follows the same pattern for the given parameters in subsequent cycles. Since MFN is 1 (meaning that MFN[0] is a logic "1"), SEL_POS follows the repeating pattern 0, 1, 2, 3, 4, 0, 1, . . . , as previously described and is updated in response to each rising edge of DIV_OUT.

With reference to the fractional phase addition circuitry 312 shown in FIG. 4, SYNC_OUT is a version of DIV_OUT sampled by CLK3 when SEL_PRE1 is 000b, 001b, or 010b, in which an appended "b" denotes a binary value. SYNC_OUT is a version of DIV_OUT sampled by CLK0 when SEL_PRE1 is 011b, 100b, and 101b (for R=5). Although CLK3 is not shown in the timing diagrams, it is an inverted and slightly delayed version of CLK0 as shown in FIG. 2. With reference to the frequency synthesizer 300 of FIG. 3, the positive MUX 344 generates CLK_MUX by selecting a corresponding one of the CLK0-CLK4 signals based on the SEL_POS value. Thus, each time the SEL_POS value is updated by a rising edge of DIV_OUT, CLK_MUX is updated accordingly. With reference again to the fractional phase addition circuitry 312 of FIG. 4, the preliminary output clock signal A is a version of SYNC_OUT sampled by rising edges of the CLK_MUX signal. As a result, A is high for a duration if $T_{IN}$ and low for a duration of $1.2*T_{IN}$.

Referring back to FIG. 6, other than periodic glitches as shown at 602, each rising edge of CLK_MUX causes a transition of the preliminary output clock signal A. The periodic glitches of CLK_MUX are inconsequential since the sampled signal SYNC_OUT remains unmodified during each of the glitches of CLK_MUX. Although the frequency of SYNC_OUT varies over time, particularly after CARRY is asserted, the sampling by CLK_MUX ensures that the period of the preliminary output clock signal A remains unmodified over time. Since the B and C signals are effectively disabled in this case, the output clock signal CLK_OUT is a slightly delayed version of A, delayed only by the output clock combination circuitry 316 which may be a simple logic gate. As shown, the high time duration of CLK_OUT is $T_{IN}$ and the low time duration is $1.2*T_{IN}$, so that the period of the output clock CLK_OUT is $T_{OUT}=2.2*T_{IN}$ as desired.

The duty cycle of CLK_OUT is less than 50% but within the resolution defined by R, or within 0.2 for R=5. If desired, the number of inverters 102 and thus R may be increased to increase the resolution to achieve an output clock signal closer to 50%.

Figure 7:
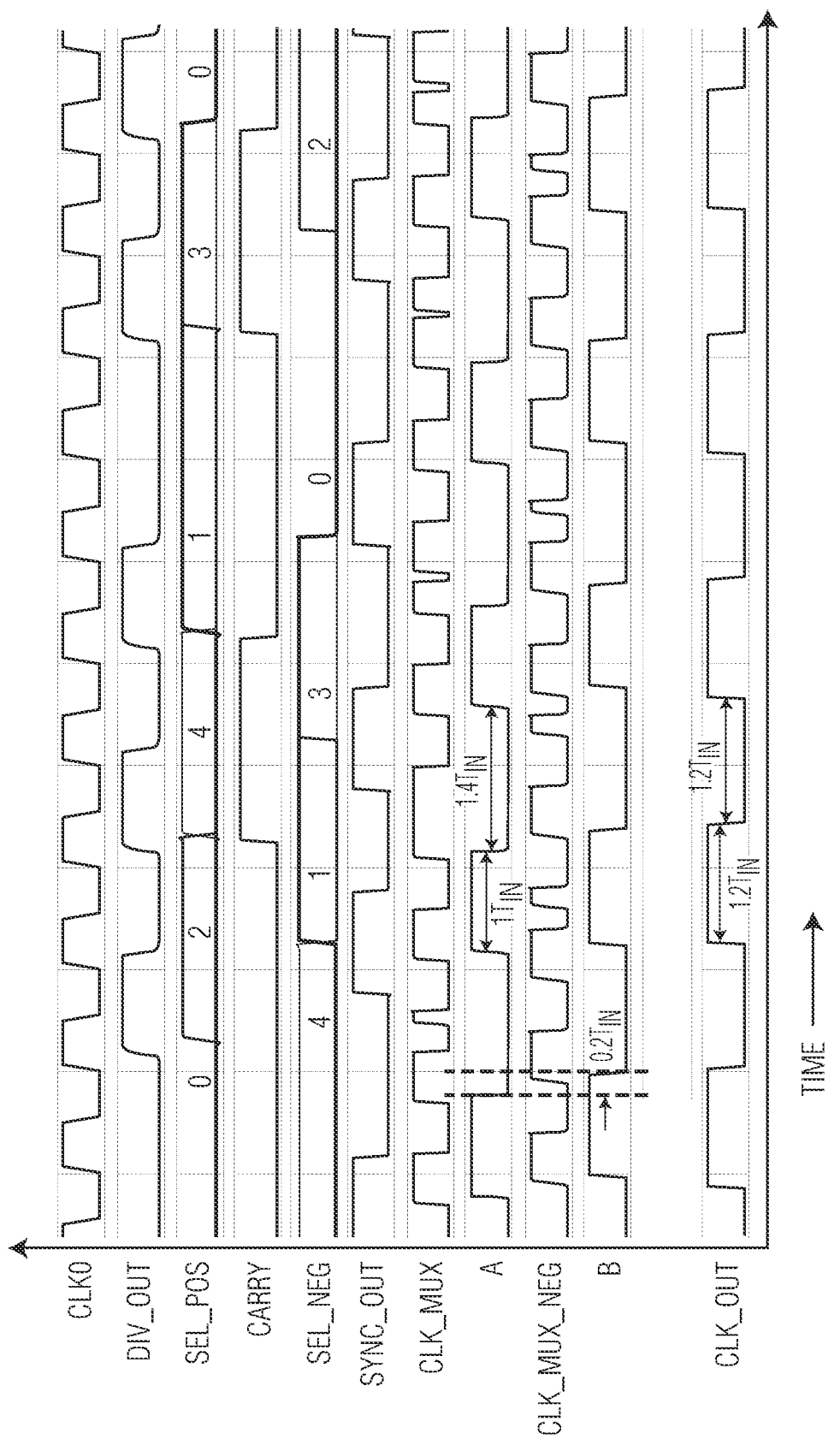

FIG. 7 is a timing diagram plotting the CLK0, DIV_OUT, SEL_POS, CARRY, SEL_NEG, SYNC_OUT, CLK_MUX, A, CLK_MUX_NEG, B, and CLK_OUT signals and values versus time for the frequency synthesizer 300 using the phased clock signals from the VCO 100 and for MFI=2 and MFN=2. These parameters correspond with frequency division by a factor of (MFI+MFN/5)=2.4, which also means period extension by 2.4. Thus, given the original period $T_{IN}$ of the input clock signal CLKIN, the period of the output clock signal CLK_OUT is $T_{OUT}=2.4*T_{IN}$. With reference to the duty cycle correction circuitry 314, since MFN[1]=1 (having a binary value of 010b), the B signal is enabled for duty cycle correction. The C signal, however, is disabled for MFI=2 since MFI[0]=0 and thus is not shown.

Initially, CARRY is a logic "0" so that DIV_OUT starts at a frequency that is one-half of CLK0 since MFI is 2. Whenever the SEL_PRE1 value is 3 or more, CY goes high and CARRY is asserted high to a logic "1" by the synchronization circuitry 342 in response to the next rising edge of DIV_OUT. In the next cycle of DIV_OUT, CARRY goes back low to a logic "0" and DIV_OUT is extended by a cycle of CLK0 in a similar manner as previously described. DIV_OUT follows the same pattern for the given parameters in subsequent cycles. Since MFN is 2 (meaning that MFN[1] is a logic "1"), SEL_POS follows the repeating pattern 0, 2, 4, 1, 3, 0, . . . , as previously described and is updated in response to each rising edge of DIV_OUT. SEL_NEG follows the same pattern as SEL_POS except delayed in time.

In a similar manner as previously described, SYNC_OUT is a version of DIV_OUT sampled by CLK3 when SEL_PRE1 is 000b-010b and is a version of DIV_OUT sampled by CLK0 when SEL_PRE1 is 011b-101b. Also, the positive MUX 344 generates CLK_MUX by selecting a corresponding one of the CLK0-CLK4 signals based on the SEL_POS value, and the preliminary output clock signal A is a version of SYNC_OUT sampled by rising edges of the CLK_MUX signal. A is high for the period $T_{IN}$ of the input clock signal and low for the period $T_{IN}$ extended by $(MFN/R)*T_{IN}=(2/5)TIN=0.4*T_{IN}$, for a total low period of $1.4*T_{IN}$. Thus, the A signal has the correct period of $2.4*T_{IN}$. In this manner, A has the correct frequency but a reduced duty cycle.

The negative MUX 346 generates CLK_MUX_NEG by selecting a corresponding one of the CLK0-CLK4 signals based on the SEL_NEG value. Thus, each time the SEL_NEG value is updated by a rising edge of DIV_OUTB, CLK_MUX_NEG is updated accordingly. With reference to the duty cycle correction circuitry 314 shown in FIG. 5, the B signal is a sampled version of the A signal based on rising edges of CLK_MUX_NEG. The falling edges of the B signal are effectively delayed relative to the A signal by $0.2*T_{IN}$. In this manner, when the A and B signals are combined (e.g., logically added) by the output clock combination circuitry 316 for providing the output clock signal CLK_OUT, the duty cycle of CLK_OUT is corrected by the B signal such that CLK_OUT has a 50% duty cycle. It is noted that the rising edges of CLK_OUT are dictated by A while the falling edges of CLK_OUT are dictated by B for pulse extension duty cycle correction. As a result, CLK_OUT has the correct period of $2.4*T_{IN}$, the correct frequency of $F_{IN}/2.4$, and a 50% duty cycle.

Figure 8:
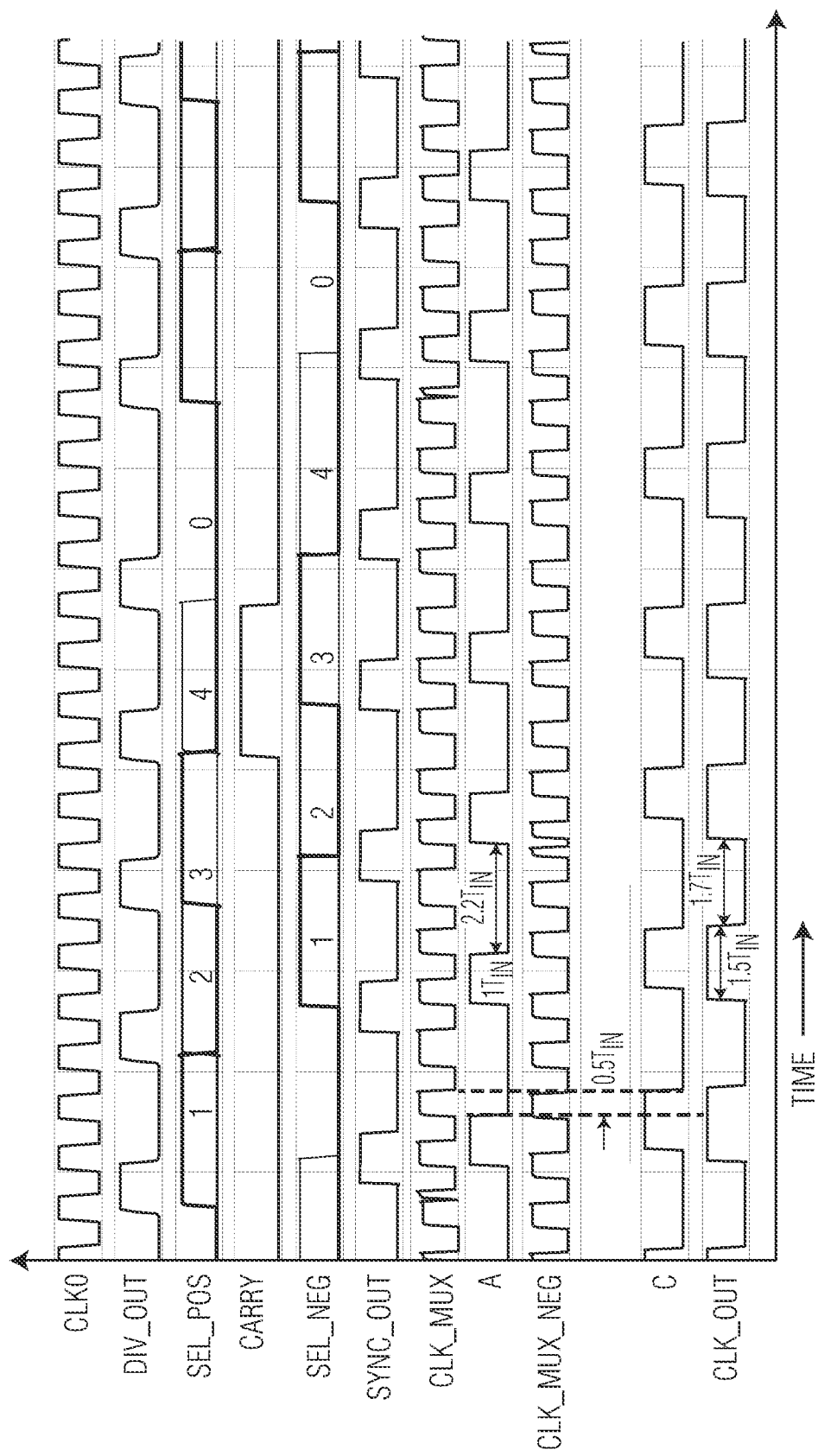

FIG. 8 is a timing diagram plotting the CLK0, DIV_OUT, SEL_POS, CARRY, SEL_NEG, SYNC_OUT, CLK_MUX, A, CLK_MUX_NEG, C, and CLK_OUT signals and values versus time for the frequency synthesizer 300 using the phased clock signals from the VCO 100 and for MFI=3 and MFN=1. These parameters correspond with frequency division by a factor of (MFI+MFN/5)=3.2, which also means period extension by 3.2. Thus, given the original period $T_{IN}$ of the input clock signal CLKIN, the period of the output clock signal CLK_OUT is $T_{OUT}=3.2*T_{IN}$. With reference to the duty cycle correction circuitry 314, since MFN[1] and MFN[2] are both logic "0", the B signal is disabled for duty cycle correction and is not shown. Since the MFI value is odd so that MFI[0] is a logic "1", however, the C signal is enabled and is shown.

Initially, CARRY is a logic "0" so that DIV_OUT starts at a frequency that is one-third of CLK0 since MFI is 3. Carry goes high to a logic "1" when SEL_POS is 4 in a similar manner as shown in FIG. 6, so that the next cycle of DIV_OUT is extended by a cycle of CLK0 in a similar manner as previously described. DIV_OUT follows the same pattern for the given parameters in subsequent cycles. Since MFN is 1 (meaning that MFN[0] is a logic "1"), SEL_POS follows the repeating pattern 0, 1, 2, 3, 4, 0, 1, . . . , as previously described and is updated in response to each rising edge of DIV_OUT. SEL_NEG follows the same pattern as SEL_POS except delayed in time.

In a similar manner as previously described, SYNC_OUT is a version of DIV_OUT sampled by CLK3 when SEL_PRE1 is 000b-010b and is a version of DIV_OUT sampled by CLK0 when SEL_PRE1 is 011b-101b. Also, the positive MUX 344 generates CLK_MUX by selecting a corresponding one of the CLK0-CLK4 signals based on the SEL_POS value, and the preliminary output clock signal A is a version of SYNC_OUT sampled by rising edges of the CLK_MUX signal. A is high for the period $T_{IN}$ of the input clock signal and is low for an extended period of $2*T_{IN}$ plus (MFN/R)*$T_{IN}=(1/5)TIN=0.2*T_{IN}$, so that the low period of A is $2.4*T_{IN}$. In this manner, A has the correct frequency but a reduced duty cycle.

As previously described, the negative MUX 346 generates CLK_MUX_NEG by selecting a corresponding one of the CLK0-CLK4 signals based on the SEL_NEG value. Thus, each time the SEL_NEG value is updated by a rising edge of DIV_OUTB, CLK_MUX_NEG is updated accordingly. With reference to the duty cycle correction circuitry 314 shown in FIG. 5, the C signal is generated by first generating a signal similar to the B signal by the synchronization circuitry 504, which is a sampled version of the A signal based on rising edges of CLK_MUX_NEG. The C signal is a sampled version of the output of the synchronization circuitry 504 based on an inverted version of CLK_MUX_NEG. The falling edges of the C signal are effectively delayed relative to the A signal by $0.5*T_{IN}$. In this manner, when the A and C signals are combined (e.g., logically added) by the output clock combination circuitry 316 for providing the output clock signal CLK_OUT, the duty cycle of CLK_OUT is corrected by the C signal such that CLK_OUT has a duty cycle that is less than but near 50%. As shown, the high time duration of CLK_OUT is $1.5*T_{IN}$ and the low time duration is $1.7*T_{IN}$, so that the period of the output clock CLK_OUT is $T_{OUT}=3.2*T_{IN}$ as desired.

It is noted that the rising edges of CLK_OUT are dictated by A while the falling edges of CLK_OUT are dictated by C for pulse extension duty cycle correction. As a result, CLK_OUT has the correct period of $3.2*T_{IN}$, the correct frequency of $F_{IN}/3.2$, and has a duty cycle that is less than 50% but within the selected resolution. As previously described, the duty cycle of CLK_OUT is less than 50% but within the resolution defined by R, or within 0.2 for R=5. If desired, the number of inverters 102 and thus R may be increased to increase the resolution to achieve an output clock signal closer to 50%.

Figure 9:
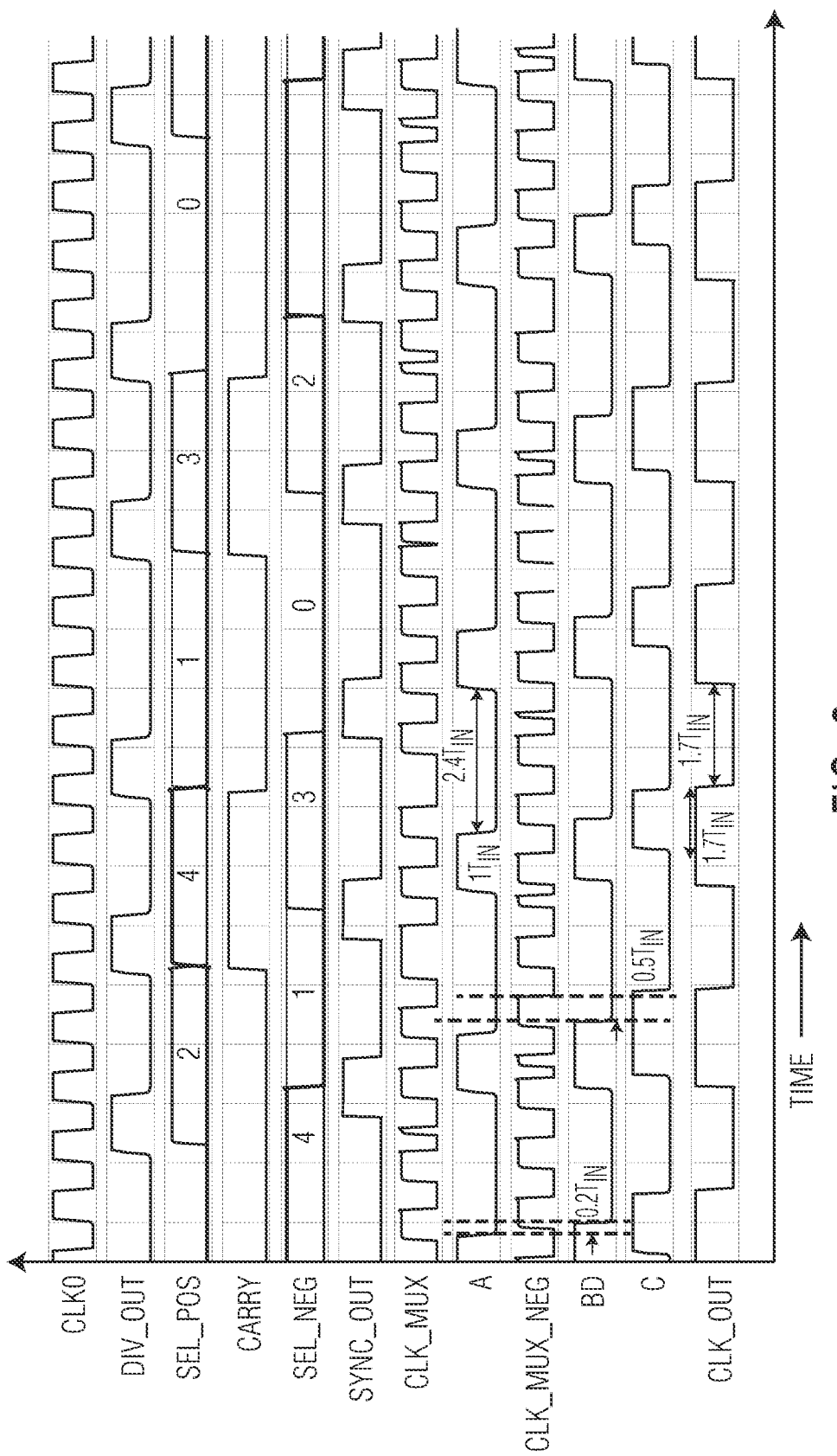

FIG. 9 is a timing diagram plotting the CLK0, DIV_OUT, SEL_POS, CARRY, SEL_NEG, SYNC_OUT, CLK_MUX, A, CLK_MUX_NEG, BD, C, and CLK_OUT signals and values versus time for the frequency synthesizer 300 using the phased clock signals from the VCO 100 and for MFI=3 and MFN=2. It is noted that the BD signal is plotted rather than B since C is actually derived by adding time to the BD signal at the output of the synchronization circuitry 504. These parameters correspond with frequency division by a factor of (MFI+MFN/5)=3.4, which also means period extension by 3.4. Thus, given the original period $T_{IN}$ of the input clock signal CLKIN, the period of the output clock signal CLK_OUT is $T_{OUT}=3.4*T_{IN}$. With reference to the duty cycle correction circuitry 314, since MFN[1] is a logic "1" and since the MFI value is an odd value, the B and C signals are both enabled.

The DIV_OUT signal is the same as that previously described for MFI=3. The pattern of the SEL_POS is the same as that previously described for MFN=2 and SEL_NEG has the same pattern as SEL_POS but delayed in time. The CLK_MUX and SYNC_OUT signals are generated in a similar manner so that the preliminary output clock signal A is also generated in a similar manner. In this case, A is high for the period $T_{IN}$ of the input clock signal and is low for an extended period of $2.4*T_{IN}$, so that the overall period of A is $3.4*T_{IN}$. Again, A has the correct frequency but a reduced duty cycle.

Referring to the duty cycle correction circuitry 314 shown in FIG. 4, the synchronization circuitry 504 outputs essentially the same signal as B but is provided to the input of the synchronization circuitry 506 clocked by an inverted version of CLK_MUX_NEG. In this manner, whereas B (or a duplicate B signal) extends the high pulse width of A by $0.2*T_{IN}$, the synchronization circuitry 506 further extends the high pulse width by an additional $0.5*T_{IN}$ for a total extension of $0.7*T_{IN}$. Thus, the output clock signal CLK_OUT has a high pulse width of $1.7*T_{IN}$ and an equal low pulse width of $1.7*T_{IN}$ for a total period of $3.4*T_{IN}$ as desired. In this manner, CLK_OUT has the desired frequency and a 50% duty cycle.

Operation is substantially the same for different values of MFI and MFN, where MFI may be any suitable integer value of 2 or more and MFN is only limited by the value R being the number of phased clock signals of a suitable VCO, such as the VCO 100 with any suitable number of inverters.

In review of the timing diagrams of FIGS. 6-9, it is appreciated that the "preliminary" output clock signal A has the correct frequency and has a consistent duty cycle in each case. In some cases, such as shown in FIG. 6, the A signal is a final result in which the output signal CLK_OUT is the same as the A signal. In this manner, the A signal may be used directly for many applications and configurations. When the A signal is sufficient for an application, the clock divider 302, the negative select circuitry 306, the MUX 346, the duty cycle correction circuitry 314 and even the output clock combination circuitry 316 may be eliminated.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A multiphase digital frequency synthesizer, comprising:
    a multiphase ring oscillator that is configured to provide a plurality of phased clock signals;
    a clock divider that is configured to divide a selected one of the plurality phased clock signals by an integer value and a carry value and that provides a divided clock signal;
    positive select circuitry that accumulates a positive select value with a fractional division factor for providing a first accumulated value, that performs a modulo function on the first accumulated value for providing a first modulo value, and that updates the positive select value in successive cycles of the divided clock signal using the first modulo value;
    carry circuitry that determines the carry value by dividing the first modulo value by a number of the phased clock signals and that updates the carry value in successive cycles of the divided clock signal;
    positive multiplex circuitry that selects from among the plurality of phased clock signals using the positive select value for providing a positive multiplexed clock signal; and
    fractional phase addition circuitry that provides a first output clock signal based on a selected one of the plurality of phased clock signals, the divided clock signal, and the positive multiplexed clock signal.

2. The multiphase digital frequency synthesizer of claim 1, wherein the multiphase ring oscillator comprises a plurality of inverters coupled in a ring configuration.

3. The multiphase digital frequency synthesizer of claim 1, wherein the clock divider divides the selected phased clock signal by the integer value while the carry value is zero and that divides the selected phased clock signal by the integer value plus the carry value when the carry value is one.

4. The multiphase digital frequency synthesizer of claim 1, wherein the positive select circuitry comprises:
    an accumulator having a first input receiving a preliminary positive select value, having a second input receiving the fractional division factor, and having an output providing the first accumulated value;
    modulo circuitry that outputs a modulus value of the first accumulated value based on a number of the phased clock signals;
    first synchronization circuitry having an input receiving the modulus value, having a clock input receiving the divided clock signal, and having an output providing the preliminary positive select value; and
    second synchronization circuitry having an input receiving the preliminary positive select value, having a clock input receiving the divided clock signal, and having an output providing the positive select value.

5. The multiphase digital frequency synthesizer of claim 4, wherein the carry circuitry comprises:
    a divider that divides the first accumulated value by the number of the phased clock signals for providing a divided value; and
    third synchronization circuitry having an input receiving the divided value, having a clock input receiving the divided clock signal, and having an output providing the carry value.

6. The multiphase digital frequency synthesizer of claim 1, wherein the positive multiplex circuitry comprises a multiplexer having a plurality of inputs receiving the phased clock signals, a select input receiving the positive select value, and an output providing the positive multiplexed clock signal.

7. The multiphase digital frequency synthesizer of claim 1, wherein the fractional phase addition circuitry comprises:
    first synchronization circuitry having an input receiving the divided clock signal, having a clock input receiving a first selected phased clock signal, and having an output providing a first preliminary synchronization clock signal;
    second synchronization circuitry having an input receiving the divided clock signal, having a clock input receiving a second selected phased clock signal, and having an output providing a second preliminary synchronization clock signal;
    a multiplexer having first and second inputs receiving the first and second preliminary synchronization signals, having a select input receiving a synchronization select value, and having an output providing a synchronization clock signal;
    third synchronization circuitry having an input receiving the synchronization clock signal, having a clock input receiving the positive multiplex clock signal, and having an output providing the first output clock signal; and
    select circuitry that provides the synchronization select value based on the positive select value and the divided clock signal.

8. The multiphase digital frequency synthesizer of claim 7, wherein the select circuitry comprises:
    a logic AND gate that logically combines the two least significant bits of a preliminary version of the positive select value for providing a first select value;

a logic OR gate that logically combines the first select value and a third least significant bit of the preliminary version of the positive select value for providing a second select value; and fourth synchronization circuitry having an input receiving the second select value, having a clock input receiving the divided clock signal, and having an output providing the synchronization select value.

9. The multiphase digital frequency synthesizer of claim 1, further comprising:

negative select circuitry that provides a negative select value by accumulating the positive select value with a truncated half value of the fractional division factor for providing a second accumulated value, that performs a modulo function on the second accumulated value for providing a second modulo value, and that updates the negative select value in successive cycles of an inverted version of the divided clock signal using the second modulo value;

negative multiplex circuitry that selects from among the plurality of phased clock signals using the negative select value for providing a negative multiplexed clock signal; and duty cycle correction circuitry that provides duty cycle adjustment signals based on the first output clock signal, the negative multiplexed clock signal, the fractional division factor, the integer value, and the divided clock signal.

10. The multiphase digital frequency synthesizer of claim 9, wherein the negative select circuitry comprises:

an accumulator having a first input receiving a preliminary positive select value comprising a preliminary version of the positive select value, a second input receiving the truncated half value of the fractional division factor, and having an output providing the second accumulated value;

modulo circuitry that outputs a modulus value of the second accumulated value based on number of the phased clock signals;

first synchronization circuitry having an input receiving the modulus value, having a clock input receiving the divided clock signal, and having an output providing a preliminary negative select value; and second synchronization circuitry having an input receiving the preliminary negative select value, having a clock input receiving an inverted version of the divided clock signal, and having an output providing the negative select value.

11. The multiphase digital frequency synthesizer of claim 9, wherein the negative multiplex circuitry comprises a multiplexer having a plurality of inputs receiving the phased clock signals, a select input receiving the negative select value, and an output providing the negative multiplexed clock signal.

12. The multiphase digital frequency synthesizer of claim 9, wherein the duty cycle correction circuitry comprises:

a logic OR gate that logically combines the second and third least significant bits of the fractional division factor for providing a first reset value;

first synchronization circuitry having an input receiving the first output clock signal, having a clock input receiving the negative multiplexed clock signal, having an inverting reset input receiving the first reset value, and having an output providing a first duty cycle adjust signal;

second synchronization circuitry having an input receiving the first output clock signal, having a clock input receiving the negative multiplexed clock signal, and having an output providing a preliminary second duty cycle adjust signal; and third synchronization circuitry having an input receiving the preliminary second duty cycle adjust signal, having a clock input receiving an inverted version of the negative multiplexed clock signal, having an inverting reset input receiving a least significant bit of the integer value, and having an output providing a second duty cycle adjust signal.

13. The multiphase digital frequency synthesizer of claim 12, further comprising output clock combination circuitry that combines the first duty cycle adjust signal, the second duty cycle adjust signal, and the first output clock signal for providing a second output clock signal with improved duty cycle.

14. A method of dividing a frequency of an oscillator by a fractional number, comprising:

receiving a plurality of phased clock signals;

dividing a selected one of the plurality phased clock signals by an integer value and a carry value and providing a divided clock signal;

accumulating a positive select value with a fractional division factor for providing a first accumulated value;

performing a modulo function on the first accumulated value based on a number of the phased clock signals for providing a first modulo value and updating the positive select value in successive cycles of the divided clock signal using the first modulo value;

generating the carry value by dividing the first modulo value by a number of the phased clock signals and updating the carry value in successive cycles of the divided clock signal;

selecting from among the plurality of phased clock signals using the positive select value for providing a positive multiplexed clock signal; and providing a first output clock signal based on a selected one of the plurality of phased clock signals, the divided clock signal, and the positive multiplexed clock signal.

15. The method of claim 14, wherein the dividing comprises dividing the selected phased clock signal by the integer value while the carry value is zero and dividing the selected phased clock signal by the integer value plus the carry value when the carry value is one.

16. The method of claim 14, wherein the providing a first output clock signal comprises:

synchronizing the divided clock signal with a first selected phased clock signal and providing a first preliminary synchronization clock signal;

synchronizing the divided clock signal with a second selected phased clock signal and providing a second preliminary synchronization clock signal;

selecting between the first and second preliminary synchronization signals using a synchronization select value for providing a synchronization clock signal;

synchronizing the synchronization clock signal with the positive multiplex clock signal and providing the first output clock signal; and providing the synchronization select value based on the positive select value and the divided clock signal.

17. The method of claim 16, wherein the providing the synchronization select value comprises:

logically AND'ing the two least significant bits of a preliminary version of the positive select value for providing a first select value;

logically OR'ing the first select value and a third least significant bit of the preliminary version of the positive select value for providing a second select value; and synchronizing the second select value with the divided clock signal for providing the synchronization select value.

18. The method of claim 16, further comprising:

accumulating the positive select value with a truncated half value of the fractional division factor for providing a second accumulated value;

performing a modulo function on the second accumulated value based on the number of the phased clock signals for providing a second modulo value, and updating the negative select value in successive cycles of an inverted version of the divided clock signal using the second modulo value;

selecting from among the plurality of phased clock signals using the negative select value for providing a negative multiplexed clock signal; and providing at least one duty cycle adjustment signal based on the first output clock signal, the negative multiplexed clock signal, the fractional division factor, the integer value, and the divided clock signal.

19. The method of claim 18, wherein the providing at least one duty cycle adjustment signal comprises:

logically OR'ing the second and third least significant bits of the fractional division factor for providing a first reset value;

synchronizing the first output clock signal with the negative multiplexed clock signal and providing a first duty cycle adjust signal;

selectively enabling the first duty cycle adjust signal with the first reset value;

synchronizing the first output clock signal with the negative multiplexed clock signal and providing a preliminary second duty cycle adjust signal;

synchronizing the preliminary second duty cycle adjust signal with an inverted version of the negative multiplexed clock signal and providing a second duty cycle adjust signal; and enabling the second duty cycle adjust signal based on a least significant bit of the integer value.

20. The method of claim 19, further comprising combining the first duty cycle adjust signal, the second duty cycle adjust signal, and the first output clock signal for providing a second output clock signal with improved duty cycle.

* * * * *